United States Patent
Islam et al.

(10) Patent No.: US 9,007,058 B2
(45) Date of Patent: Apr. 14, 2015

(54) DUAL-STAGE TRAPPED-FLUX MAGNET CRYOSTAT FOR MEASUREMENTS AT HIGH MAGNETIC FIELDS

(75) Inventors: Zahirul Islam, Aurora, IL (US); Ritesh K. Das, Woodridge, IL (US); Roy Weinstein, Houston, TX (US)

(73) Assignee: UChicago Argonne, LLC, Chicago, IL (US)

( * ) Notice: Subject to any disclaimer, the term of this patent is extended or adjusted under 35 U.S.C. 154(b) by 574 days.

(21) Appl. No.: 13/405,436

(22) Filed: Feb. 27, 2012

(65) Prior Publication Data

US 2013/0221958 A1 Aug. 29, 2013

(51) Int. Cl.
*G01R 33/00* (2006.01)

(52) U.S. Cl.
CPC .................................. *G01R 33/0047* (2013.01)

(58) Field of Classification Search
CPC ............ G01N 27/023; G01N 27/9033; G01R 33/038; G01R 33/031
USPC ............ 324/248, 505, 327, 527, 528, 257.31; 505/844, 845, 879, 893; 335/216
See application file for complete search history.

(56) References Cited

U.S. PATENT DOCUMENTS

| | | | |
|---|---|---|---|
| 5,349,291 A * | 9/1994 | Kotani et al. ................. | 324/248 |
| 5,444,425 A | 8/1995 | Hermann et al. | |
| 5,506,500 A * | 4/1996 | Krause et al. ................ | 324/201 |
| 5,637,995 A * | 6/1997 | Izawa et al. ................... | 324/174 |
| 6,411,087 B1* | 6/2002 | Fan et al. ...................... | 324/303 |
| 6,525,002 B1 | 2/2003 | Weinstein | |
| 6,869,915 B2 | 3/2005 | Weinstein | |
| 7,249,521 B1* | 7/2007 | Frasca ............................ | 73/799 |
| 2003/0112158 A1* | 6/2003 | Babin ............................ | 341/15 |
| 2003/0219141 A1* | 11/2003 | Sugata et al. ................. | 381/430 |
| 2005/0083058 A1* | 4/2005 | Itoh et al. ..................... | 324/318 |
| 2006/0131602 A1* | 6/2006 | Ouderkirk et al. ........... | 257/100 |
| 2008/0094761 A1* | 4/2008 | Freitag et al. ........... | 360/324.12 |
| 2009/0272127 A1* | 11/2009 | Radovinsky et al. ......... | 62/50.7 |
| 2010/0081260 A1* | 4/2010 | Chen ............................ | 438/478 |
| 2011/0285236 A1* | 11/2011 | Davey et al. ............ | 310/156.01 |
| 2013/0023418 A1* | 1/2013 | Ackermann et al. .......... | 505/162 |
| 2013/0076694 A1* | 3/2013 | Yeh ............................... | 345/175 |

* cited by examiner

*Primary Examiner* — Arleen M Vazquez
*Assistant Examiner* — Dominic Hawkins
(74) *Attorney, Agent, or Firm* — Joan Pennington

(57) ABSTRACT

A method and a dual-stage trapped-flux magnet cryostat apparatus are provided for implementing enhanced measurements at high magnetic fields. The dual-stage trapped-flux magnet cryostat system includes a trapped-flux magnet (TFM). A sample, for example, a single crystal, is adjustably positioned proximate to the surface of the TFM, using a translation stage such that the distance between the sample and the surface is selectively adjusted. A cryostat is provided with a first separate thermal stage provided for cooling the TFM and with a second separate thermal stage provided for cooling sample.

20 Claims, 9 Drawing Sheets

DUAL-STAGE TRAPPED-FLUX MAGNET CRYOSTAT FOR MEASUREMENTS AT HIGH MAGNETIC FIELDS

CONTRACTUAL ORIGIN OF THE INVENTION

The United States Government has rights in this invention pursuant to Contract No. DE-AC02-06CH11357 between the United States Government and UChicago Argonne, LLC representing Argonne National Laboratory.

FIELD OF THE INVENTION

The present invention relates generally to a method and apparatus for material testing, and more particularly, relates to a method and a dual-stage trapped-flux magnet cryostat for implementing enhanced measurements at high magnetic fields.

DESCRIPTION OF THE RELATED ART WHILE

A need exists to provide generally unrestricted optical access for particle-in-particle-out, for example, light, x-rays, neutrons, and the like, measurements of properties of materials as a function of external parameters, for example, temperature, and subjected to high magnetic fields.

There are two long-standing problems in particle-in particle-out studies in high magnetic fields (B). These problems generally include limited optical access; and practical impossibility to apply magnetic fields parallel to momentum transfer to probe particles, such as photons and neutrons.

These problems become insurmountable when high magnetic fields are needed. It is quite common for researchers to face the need to measure characteristics of an order parameter (OP) with primary ordering vector parallel to the applied magnetic fields and determine OP anisotropy by measuring the dependence of scattering intensity on azimuth, i.e. rotation of the sample around the particle momentum transfer.

Commercial superconducting magnets in split-pair and solenoid are typically used at synchrotron and neutron research facilities. These superconducting magnets are expensive with high cost of ownership, are very large, generating large fringe fields that interfere with delicate electronics, detectors, and motors, have limited x-ray and neutron accessibility of the sample being studied, restrict scanning view angles, and usually require elaborate cooling schemes using both liquid nitrogen and helium.

Using magnets, either resistive or superconducting, in split-pair and solenoid geometries, these OP measurements described above are in general impossible to carry out, or completely impractical to implement.

SUMMARY OF THE INVENTION

Principal aspects of the present invention are to provide a method and a dual-stage trapped-flux magnet cryostat apparatus for implementing enhanced measurements at high magnetic fields. Other important aspects of the present invention are to provide such method and dual-stage trapped-flux magnet cryostat apparatus substantially without negative effect and that overcome some of the disadvantages of prior art arrangements.

In brief, a method and a dual-stage trapped-flux magnet cryostat apparatus are provided for implementing enhanced measurements at high magnetic fields. The dual-stage trapped-flux magnet cryostat apparatus includes a trapped-flux magnet (TFM). A sample, for example, a single crystal, is adjustably positioned proximate to the surface of the TFM, using a translation stage such that the distance between the sample and the surface is selectively adjusted. A cryostat is provided with a first separate thermal stage for cooling the TFM and with a second separate thermal stage for cooling sample.

In accordance with features of the invention, the trapped-flux magnet (TFM) comprises a melt-textured bulk high-temperature superconductor (SC) disk magnetized by trapping quantized magnetic flux on pinning centers below the superconducting transition temperature ($T_c$) to act as a permanent magnet.

In accordance with features of the invention, the dual-stage trapped-flux magnet cryostat apparatus is a compact device, is portable and can be used on any standard diffractometers, and other laboratory settings.

In accordance with features of the invention, the trapped-flux magnet (TFM) comprises an axial hole or opening receiving a post, such as a copper, sapphire post, which supports the sample. A dome member encloses the sample on the support post. For bulk thermodynamic and transport measurements aluminum can be used. By controlling the sample-to-TFM distance magnetic fields at the sample location can be easily changed since the field falls off with increasing distance from the surface. The sample distance from TFM surface can be varied on the order of a centimeter or more through the axial hole.

In accordance with features of the invention, a selected shroud material may be used, such as beryllium, or glass for optical diffraction, or aluminum for neutrons.

In accordance with features of the invention, a Hall probe is mounted near the sample for monitoring the magnetic field for testing measurements, temperature sensors for monitoring temperature, and resistive encoders for monitoring TFM-to-sample distance in situ.

In accordance with features of the invention, the TFM is annular with a centrally located axial opening or hole, for example, about 5 mm, for the sample post to freely travel along the TFM axis. TFM sizes vary depending on maximum field requirements, such as 8-30 mm in outer diameter, and 4-15 mm in thickness. The hole diameter and the aspect ratio of the TFM can be chosen to meet specific field requirements.

In accordance with features of the invention, the TFM is attached to the first stage of the cryostat with full temperature control, for example, from ≤30° K. exceeding room temperature. The sample mounted on the support post or cold finger is attached to the second stage, and a translation stage, such as a piezo-controlled translation stage, moves the sample through the TFM. For example, the second stage of the cryostat has a base temperature of <2.8° K. Since the sample is attached to second stage its temperature can be changed independently while the magnetized TFM is kept at ≤30° K.

In accordance with features of the invention, during activation of the TFM it is warmed above $T_c$, such as about 92° K. for YBCO and the sample is kept at a desired temperature on the second stage. Once magnetized by cooling the TFM in external magnetic fields, the TFM remains at the temperature of the first stage for example, ≤30° K. during the course of subsequent measurements on the sample.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and a dual-stage trapped-flux magnet cryostat apparatus are provided for implementing enhanced measurements at high magnetic fields.

Figure 1A:
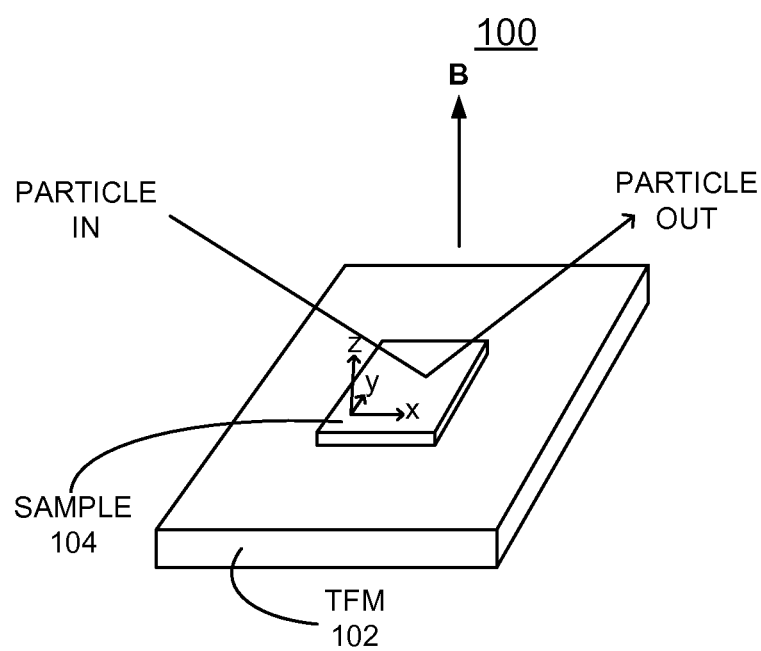
FIGS. 1A and 1B schematically illustrate example dual-stage trapped-flux magnet cryostat apparatus for implementing enhanced measurements at high magnetic fields in accordance with preferred embodiments.
Figure 1B:
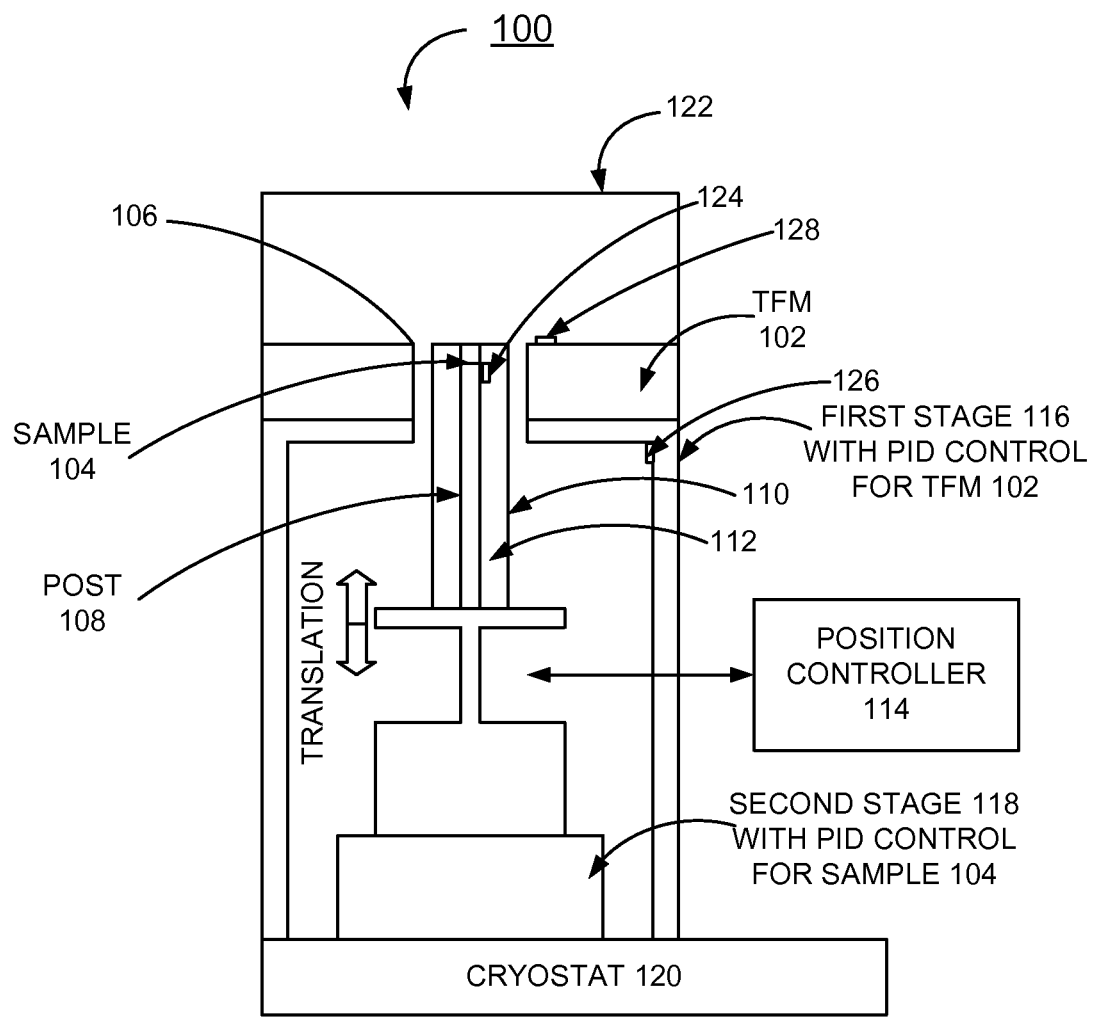

Having reference now to the drawings, in FIGS. 1A and 1B, there is shown respective example dual-stage trapped-flux magnet cryostat apparatus for implementing enhanced measurements at high magnetic fields generally designated by the reference character 100 in accordance with a preferred embodiment.

Advantages of the dual-stage trapped-flux magnet cryostat apparatus 100 in accordance with preferred embodiments of the invention are that apparatus 100 is a small, compact, and portable device capable of creating high magnetic fields for condensed matter research, with a small magnetic fringe footprint. The dual-stage trapped-flux magnet cryostat apparatus 100 is the first device of this type. The dual-stage trapped-flux magnet cryostat apparatus 100 is a relatively inexpensive device. The dual-stage trapped-flux magnet cryostat apparatus 100 enables a large optical viewing range of a hemisphere or 360 degrees in the x-y plane. The dual-stage trapped-flux magnet cryostat apparatus 100 provides independent control of the sample and magnet temperatures using a single cryostat. Magnetic field at the sample is easily changed by varying sample-to-TFM distance. Access to large magnetic fields, for example up to 5 T, and higher to approximately 20 T with large TFM units are provided. The magnetic field is stable for days, for example, during 250 hours of measurements only 5% loss of initial magnetization was observed with less than 1% variations over the course of a day.

Referring first to FIG. 1A, there is shown a portion of apparatus 100 including a trapped-flux magnet (TFM) 102 together with a sample 104 illustrating a generally unrestricted optical window over generally a whole hemisphere or 360° (360 degrees) in the x-y plane. An arrow labeled B represents a magnetic field direction, with another arrow representing Particle in and Particle out to and from the sample 104.

Referring to FIG. 1B, there is shown the example dual-stage trapped-flux magnet cryostat apparatus 100 in accordance with a preferred embodiment. A sample 104, for example, a single crystal, is adjustably mounted proximate to the surface of the trapped-flux magnet (TFM) 102. The trapped-flux magnet (TFM) 102 includes a centrally located axial hole 106 receiving a post 108 carrying the sample 104 inside a dome member 110, such as a Be dome 110 with helium He exchange gas 112. Also the sample 104 can be placed in vacuum or the He exchange gas 112.

A position controller 114 operatively controls a first stage 116 with proportional-integral-derivative (PID) controller or other feedback controller for the TFM 102, and a second stage 118 with proportional-integral-derivative (PID) controller or other feedback controller for the sample 102. A single cryostat 120 is provided with the first separate thermal stage 116 provided for cooling the TFM 102 and with the second separate thermal stage 118 provided for cooling sample 104. The dual-stage trapped-flux magnet cryostat apparatus 100 includes an enclosure radiation shield 122. The dual-stage trapped-flux magnet cryostat apparatus 100 additionally includes electrical connections, feed through ports, a vacuum shroud, and a compressor not shown.

The trapped-flux magnet (TFM) 102 of the preferred embodiment comprises a melt-textured bulk high-temperature superconductor (SC) disk magnetized by trapping quantized magnetic flux on pinning centers below the superconducting transition temperature ($T_c$) to act as a permanent magnet.

The trapped-flux magnet (TFM) 102 includes the axial hole or opening 106 receiving the post 108, copper, sapphire post 108, which supports the sample 104. The annular TFM 102 implemented by melt-textured YBCO of approximately 20 mm diameter with the centrally located axial opening or hole 106, which is, for example, about 5 mm, for the sample post to freely travel along the TFM axis. Sizes of the TFM 102 vary depending on maximum field requirements, such as 8-30 mm in outer diameter, and 4-15 mm in thickness.

By controlling the sample-to-TFM distance magnetic fields at the sample location can be easily changed since the field falls off with increasing distance from the TFM surface. The sample distance from TFM surface can be varied on the order of a centimeter or more through the axial hole 106. For example, the range of sample distance from TFM surface is about 12 mm for application below 5 T. It is possible to increase the magnetic field to higher levels, ~20 T; the shroud and sample-holder lengths are increased to accommodate a much larger TFM 102, such as 10-30 mm outside diameter (OD), and larger range of travel for the sample 104 from the TFM 102.

The dome member 110 is formed by a selected shroud material, such as beryllium, or glass for optical diffraction, or aluminum for neutrons. For example, the dome member 110 enclosing the sample 104 on the support post 108 can be implemented with aluminum for bulk thermodynamic and transport measurements.

A plurality of sensors 124 including a Hall probe and temperature sensors is mounted on the post 108 near the sample 104 for monitoring the magnetic field and temperature for testing measurements in situ and a plurality of sensors 126 including temperature sensors for monitoring temperature, and resistive encoders for monitoring TFM-to-sample distance in situ is attached to the first stage 116 with the PID control that holds the TFM 102. Also a removable Hall probe array 128 can be mounted on the surface of TFM 102 when needed primarily for diagnostics.

The TFM 102 is attached to the first stage 116 of the cryostat 120 with full temperature control, for example, from ≤30° K. up to and above room temperature. The sample 104 is attached to the second stage 118 with a piezo-controlled translation stage indicated by arrow labeled TRANSLATION on the support post or cold finger, for example, with the second stage 118 of the cryostat 120 having a base temperature of <2.8° K. Since the sample 104 is attached to second stage 118 its temperature can be changed independently while the magnetized TFM 102 is kept at ≤30° K.

During activation of the TFM 102 it is warmed above $T_c$, such as about 92° K. for a YBCO, (yttrium-barium-copper-oxide) TFM and the sample 104 is kept at a desired temperature on the second stage 118. Once magnetized by cooling the TFM 102 in external magnetic fields the TFM remains at the temperature of the first stage 116 for example, ≤30° K. during the course of subsequent measurements on the sample 104.

Referring to FIGS. 2, 3, 4, 5, 6, 7, and 8, there are shown respective example waveforms illustrating example characteristics and operation of the dual-stage trapped-flux magnet cryostat apparatus 100 in accordance with preferred embodiments.

Figure 2:
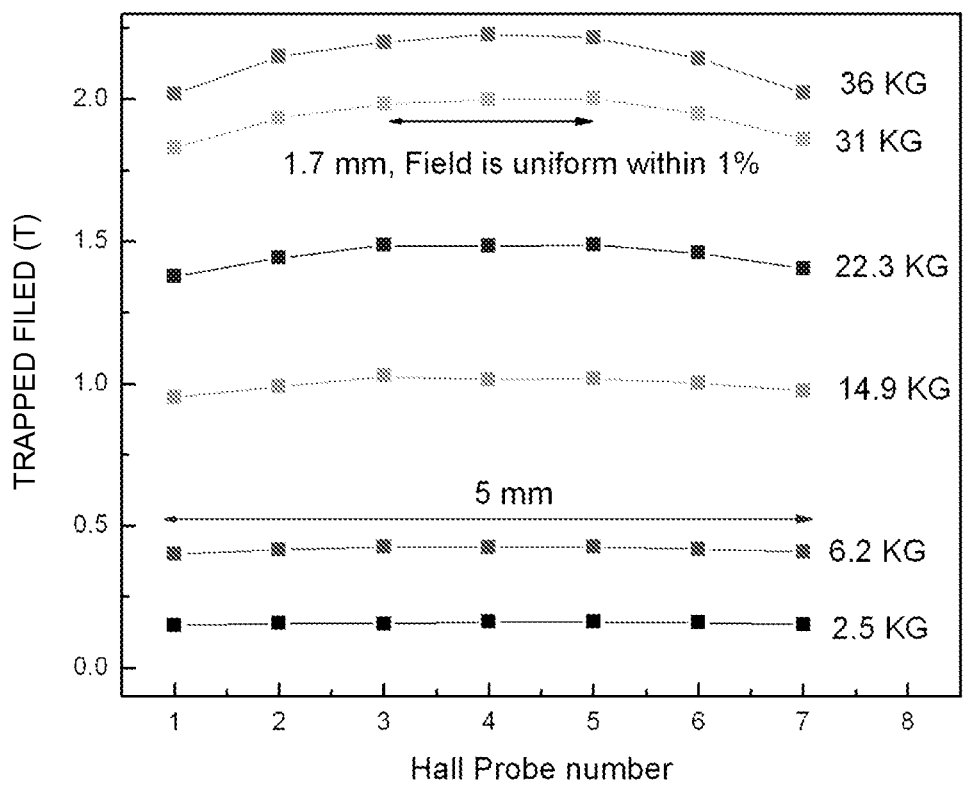
FIGS. 2, 3, 4, 5, 6, 7, and 8 are respective example waveforms illustrating example characteristics and operation of the apparatus of FIG. 1B, in accordance with preferred embodiments.

In FIG. 2, general uniformity of a trapped field (T) is illustrated with the trapped field (T) measured at a very close distance parallel to the TFM surface and a Hall probe number of the Hall probe array 128 shown with respect to the horizontal axis. For example, the trapped field is uniform within 1% over an area of 2 mm×2 mm on the surface of TFM 102.

Figure 3:
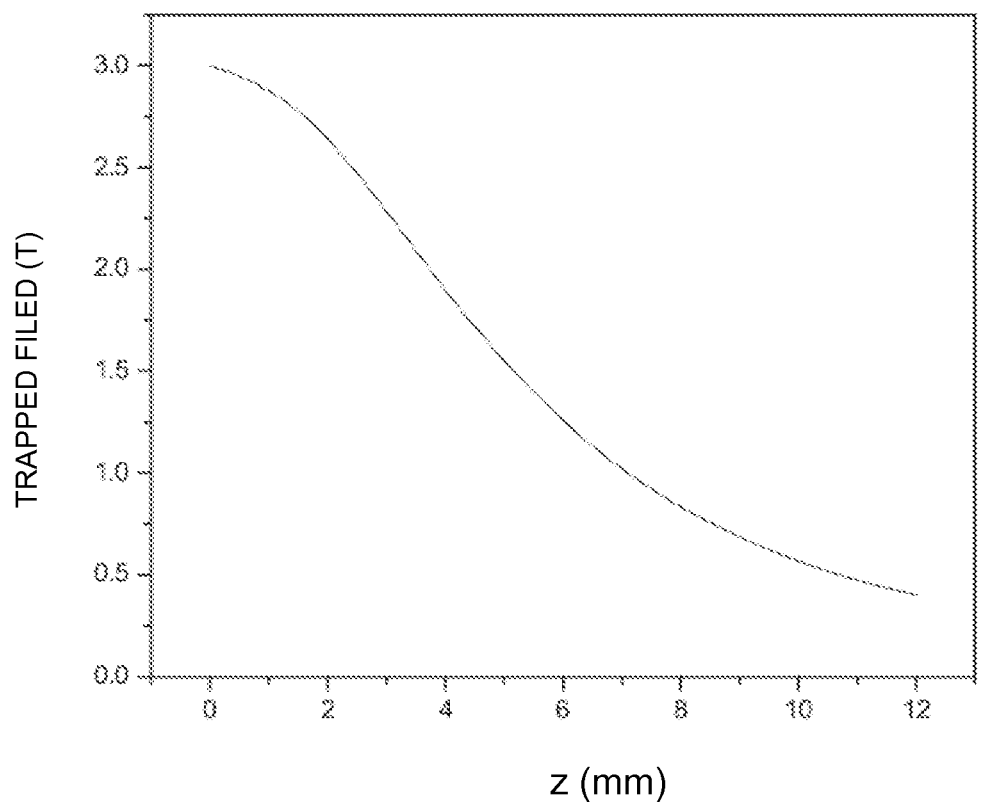
Figure 4:
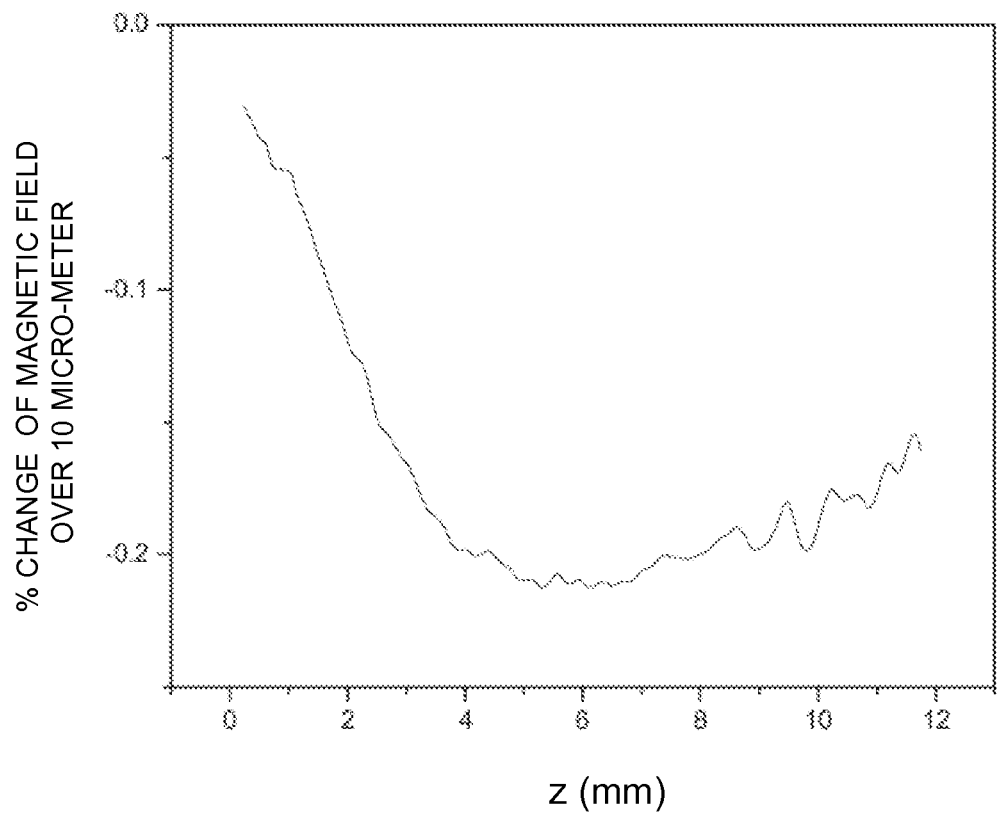

In FIGS. 3 and 4, there are shown respective trapped field versus distance from the TFM surface with the trapped field (T) and % change magnetic field over 10 micro-meters shown with respect to the respective vertical axis and a distance in mm along a z direction shown with respect to the horizontal axis. As shown, the magnetic field can be changed by changing the distance from the TFM surface. The uniformity of the magnetic field along the z direction is within 0.25% over 10 micro-meters.

Figure 5:
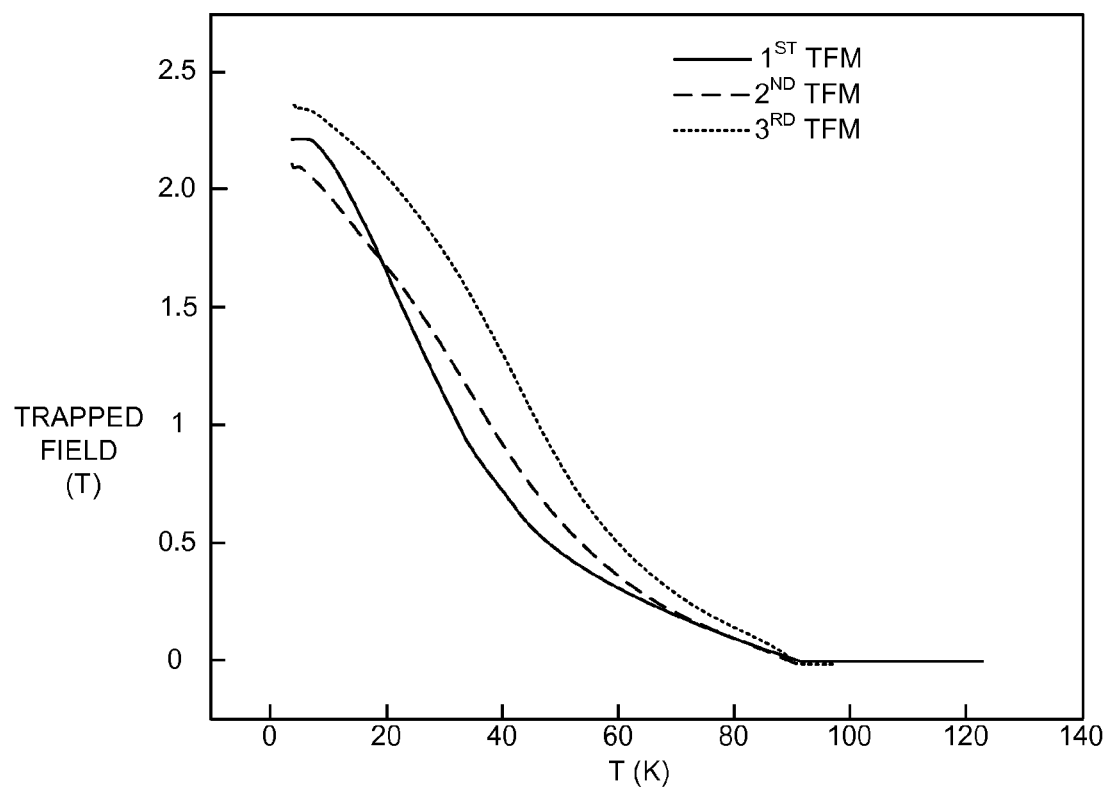

In FIG. 5, trapped field (T) is illustrated as a function of temperature with the trapped field (T) measured at a very close distance parallel to the TFM surface and temperature (K) shown with respect to the horizontal axis. For example, the trapped field decreases with increasing temperature as critical current decreases. Temperature adjustment of the TFM 102 provides an additional way to decrease magnetic fields without changing the sample position.

Figure 6:
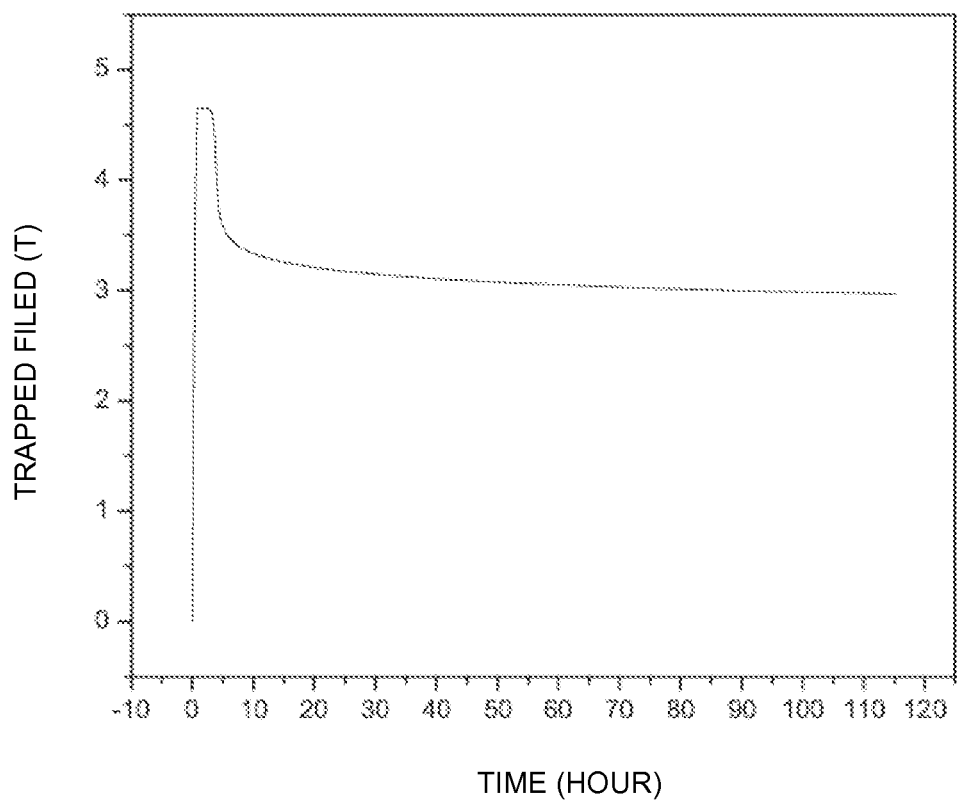
Figure 7:
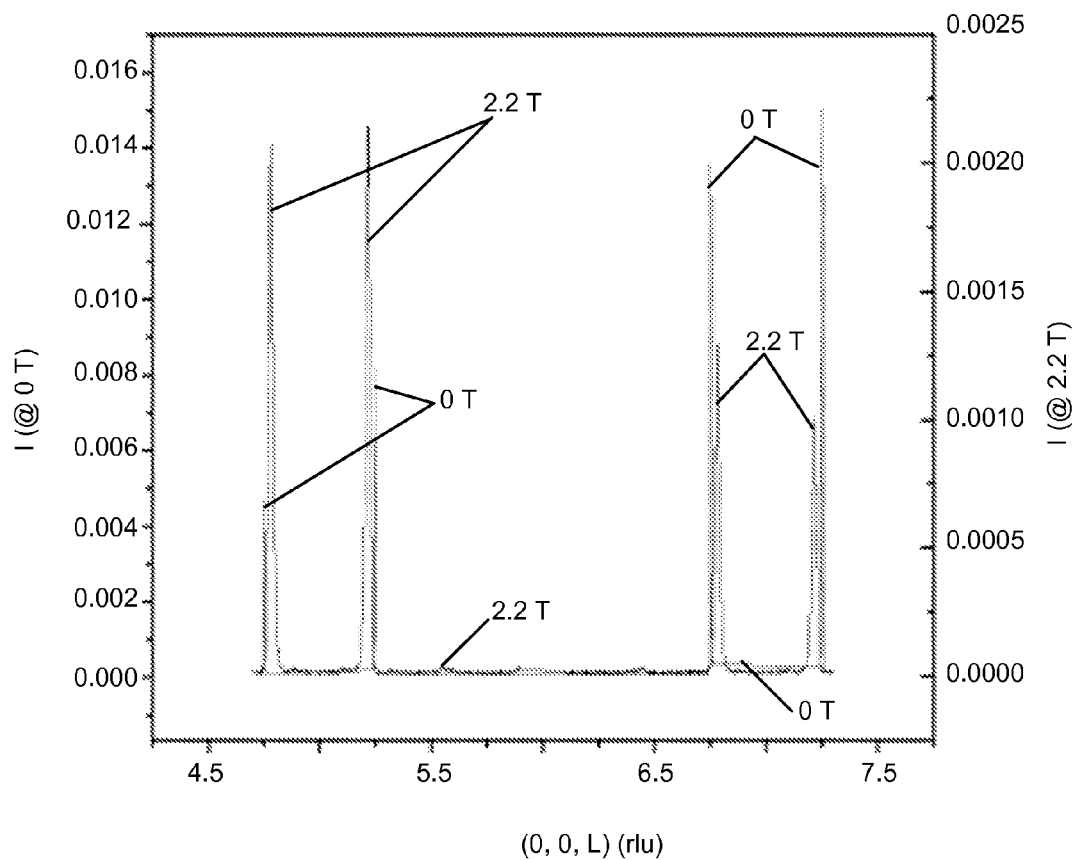
Figure 8:
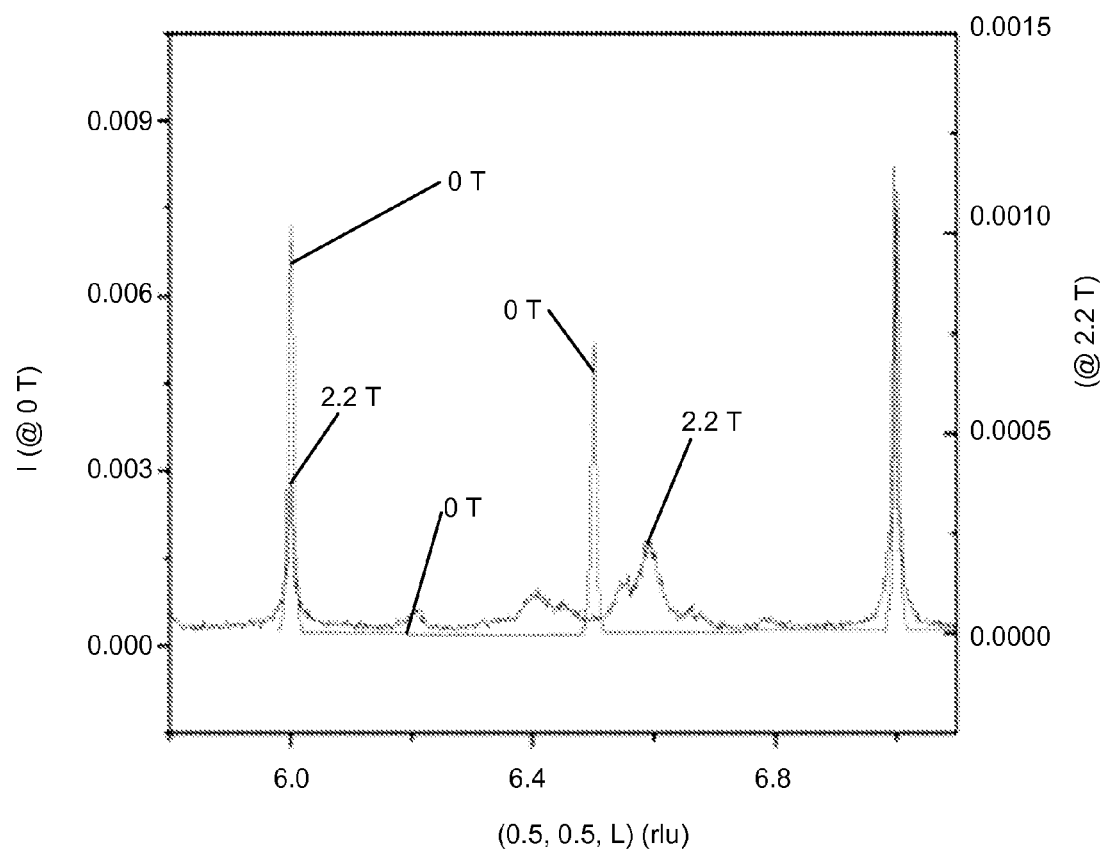

In FIG. 6, stability of trapped field (T) is illustrated as a function of time with the trapped field (T) shown with respect to the vertical axis and time (hours) shown with respect to the horizontal axis. For example, the trapped field is stable over a long period of time within approximately 1%. The trapped field remains stable providing practically uniform magnetic fields for days, which are sufficient for comprehensive x-ray diffraction experiments, specifically x-ray resonance exchange scattering (XRES) to study field-induced phenomena at a modern synchrotron source In FIGS. 7 and 8, there are shown x-ray data at 0 T and 2.2 T respective trapped field with the trapped field (T) at 0 T and 2.2 T shown with respect to the respective vertical axis and zero-field phase (0.0. L) (riu) shown with respect to the horizontal axis. As shown, profound changes of the zero-field phase result in applied magnetic fields.

While the present invention has been described with reference to the details of the embodiments of the invention shown in the drawing, these details are not intended to limit the scope of the invention as claimed in the appended claims.

What is claimed is:

1. A method for implementing measurements at high magnetic fields using dual-stage trapped-flux magnet (TFM) cryostat apparatus comprising:
   providing a trapped-flux magnet (TFM);
   positioning a sample proximate to a surface of said TFM,
   selectively adjusting a distance between said sample and said TFM surface for selectively changing a magnetic field at said sample;
   providing a single cryostat;
   cooling said TFM using a first separate thermal stage coupled to said single cryostat; and
   cooling said sample using a second separate thermal stage coupled to said single cryostat; said single cryostat providing independent temperature control of said TFM and said sample.

2. The method as recited in claim 1 wherein providing said trapped-flux magnet (TFM) includes providing a melt-textured bulk high-temperature superconductor (SC) disk magnetizable by trapping quantized magnetic flux on pinning centers below the superconducting transition temperature ($T_c$) to act as a permanent magnet.

3. The method as recited in claim 1 wherein providing said trapped-flux magnet (TFM) includes providing an axial opening in said trapped-flux magnet (TFM) for receiving a post supporting said sample.

4. The method as recited in claim 3 includes forming said post of a selected material including one of copper and sapphire.

5. The method as recited in claim 3 includes providing a dome member enclosing said sample on said support post.

6. The method as recited in claim 5 includes providing said sample in a helium exchange gas within said dome member.

7. The method as recited in claim 5 includes forming said dome member of a selected one of glass, beryllium, and aluminum based upon measurements being performed.

8. The method as recited in claim 1 includes providing a piezo-controlled translation stage for selectively adjusting said distance between said sample and said TFM surface for selectively changing the magnetic field at said sample.

9. The method as recited in claim 1 wherein cooling said TFM using a first separate thermal stage coupled to said cryostat; and cooling said sample using a second separate thermal stage coupled to said cryostat includes independently controlling temperature of said sample and temperature of said TFM.

10. The method as recited in claim 1 includes monitoring a magnetic field proximate said sample, monitoring temperature, and monitoring TFM-to-sample distance for testing measurements.

11. A dual-stage trapped-flux magnet (TFM) cryostat apparatus for implementing measurements at high magnetic fields comprising:
   a trapped-flux magnet (TFM);
   a sample being positioned proximate to a surface of said TFM,
   a translation stage carrying said sample selectively adjusting a distance between said sample and said TFM surface for selectively changing a magnetic field at said sample;
   a single cryostat;
   a first separate thermal stage coupled to said single cryostat for cooling said TFM; and
   a second separate thermal stage coupled to said cryostat for cooling said sample; said single cryostat providing independent temperature control of said TFM and said sample.

12. The dual-stage trapped-flux magnet cryostat apparatus as recited in claim 11 wherein said trapped-flux magnet (TFM) comprises a melt-textured bulk high-temperature superconductor (SC) disk magnetizable by trapping quantized magnetic flux on pinning centers below the superconducting transition temperature ($T_c$) to act as a permanent magnet.

13. The dual-stage trapped-flux magnet cryostat apparatus as recited in claim 11 wherein said trapped-flux magnet (TFM) comprises an axial opening receiving a post supporting said sample.

14. The dual-stage trapped-flux magnet cryostat apparatus as recited in claim 13 wherein said post is formed of a selected material including one of copper and sapphire.

15. The dual-stage trapped-flux magnet cryostat apparatus as recited in claim 13 includes a dome member enclosing said sample on said support post.

16. The dual-stage trapped-flux magnet cryostat apparatus as recited in claim 15 wherein said dome member is formed of a selected one of glass, beryllium, and aluminum.

17. The dual-stage trapped-flux magnet cryostat apparatus as recited in claim 15 wherein said sample is placed in a helium exchange gas within said dome member.

18. The dual-stage trapped-flux magnet cryostat apparatus as recited in claim 15 wherein said translation stage includes a piezo-controlled translation stage and said distance between said sample and said TFM surface is selectively adjusted to change the magnetic field at said sample.

19. The dual-stage trapped-flux magnet cryostat apparatus as recited in claim 11 includes a compact and portable device.

20. The dual-stage trapped-flux magnet cryostat apparatus as recited in claim 11 includes a Hall probe located near said sample for monitoring a magnetic field for testing measurements, temperature sensors for monitoring temperature, and resistive encoders for monitoring TFM-to-sample distance.

* * * * *